United States Patent
Yadav (10) Patent No.: US 10,855,277 B1
(45) Date of Patent: Dec. 1, 2020

(54) MITIGATING RELIABILITY ISSUES IN A LOW-VOLTAGE REFERENCE BUFFER DRIVEN BY A HIGH-VOLTAGE CIRCUIT

(71) Applicant: QUALCOMM Incorporated, San Diego, CA (US)

(72) Inventor: Kshitij Yadav, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 16/773,645

(22) Filed: Jan. 27, 2020

(51) Int. Cl.
| | | |
|---|---|---|
| H02H 3/18 | (2006.01) | |
| H02H 3/22 | (2006.01) | |
| H03K 19/00 | (2006.01) | |
| H03K 19/0185 | (2006.01) | |

(52) U.S. Cl.
CPC . *H03K 19/0027* (2013.01); *H03K 19/018585* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,905,617 A | * | 5/1999 | Kawasoe | H03F 1/52 361/86 |
| 7,482,877 B2 | * | 1/2009 | Kim | H03F 1/0205 330/207 P |
| 10,008,935 B2 | * | 6/2018 | Kawano | G01K 3/005 |

* cited by examiner

*Primary Examiner* — An T Luu
(74) *Attorney, Agent, or Firm* — Patterson & Sheridan, LLP (57) ABSTRACT

Certain aspects of the present disclosure provide circuitry connecting an output of voltage reference circuitry powered by a relatively high voltage to an input of a voltage buffer configured to generate a voltage lower than the high voltage. The connecting circuitry prevents the high voltage from reaching the input of the voltage buffer. One example electronic circuit generally includes a voltage reference circuit configured to be powered by a relatively higher voltage, a buffer circuit configured to generate a relatively lower voltage as compared to the relatively higher voltage, and circuitry coupled between an output of the voltage reference circuit and an input of the buffer circuit, the circuitry being configured to prevent the higher voltage from reaching the input of the buffer circuit.

19 Claims, 5 Drawing Sheets

MITIGATING RELIABILITY ISSUES IN A LOW-VOLTAGE REFERENCE BUFFER DRIVEN BY A HIGH-VOLTAGE CIRCUIT

TECHNICAL FIELD

Certain aspects of the present disclosure generally relate to electronic circuits and, more particularly, to techniques and apparatus for mitigating reliability issues in driving a low-voltage buffer circuit with a high-voltage reference circuit.

BACKGROUND

A speaker is a transducer that produces a pressure wave in response to an input electrical signal, and thus, sound is generated. The speaker input signal may be produced by an audio amplifier that receives a relatively lower voltage analog audio signal and generates an amplified signal (with a relatively higher voltage) to drive the speaker. A dynamic loudspeaker is typically composed of a lightweight diaphragm (a cone) connected to a rigid basket (a frame) via a flexible suspension (often referred to as a spider) that constrains a voice coil to move axially through a cylindrical magnetic gap. When the input electrical signal is applied to the voice coil, a magnetic field is created by the electric current in the coil, thereby forming a linear electric motor. By varying the electrical signal from the audio amplifier, the mechanical force generated by the interaction between the magnet and the voice coil is modulated and causes the cone to move back and forth, thereby creating the pressure waves interpreted as sound.

Electronic devices implemented with a speaker may include circuitry for sensing various characteristics of the analog signal driving the speaker. An analog-to-digital converter (ADC) may be used to convert such an analog signal to a digital signal, typically for performing signal processing in the digital domain. Several types of ADCs are available, each with varying advantages and disadvantages. For example, a successive approximation register (SAR) ADC may provide an area and power-efficient architecture for low-to-medium accuracy analog-to-digital conversion applications. A SAR ADC may use a digital-to-analog converter (DAC) and a comparator to approximate a digital value corresponding to an analog input. Another type of ADC referred to as a flash ADC may provide a faster conversion speed at the cost of an exponential increase in power and area consumption. The ADC may be implemented with a reference voltage against which the input analog signal is compared. In some cases, the ADC may include a reference buffer circuit for buffering the reference voltage.

SUMMARY

Certain aspects of the present disclosure generally relate to mitigating reliability issues in driving a relatively lower voltage buffer circuit with a relatively higher voltage reference circuit.

Certain aspects of the present disclosure provide an electronic circuit. The electronic circuit generally includes a voltage reference circuit configured to be powered by a relatively higher voltage, a buffer circuit configured to generate a relatively lower voltage as compared to the relatively higher voltage, and circuitry coupled between an output of the voltage reference circuit and an input of the buffer circuit, the circuitry being configured to prevent the higher voltage from reaching the input of the buffer circuit.

Certain aspects of the present disclosure provide a method of driving a buffer circuit. The method generally includes powering a voltage reference circuit from a relatively higher voltage; generating, with the buffer circuit, a relatively lower voltage as compared to the relatively higher voltage, the lower voltage being based on a voltage reference value output from the voltage reference circuit; and preventing the higher voltage from reaching an input of the buffer circuit.

Certain aspects of the present disclosure provide an electronic circuit. The electronic circuit generally includes a voltage reference circuit configured to be powered by a relatively higher voltage, a buffer circuit configured to generate a relatively lower voltage as compared to the relatively higher voltage, a first switch coupled between an output of the voltage reference circuit and an input of the buffer circuit; and a second switch coupled between the input of the buffer circuit and a reference potential node for the electronic circuit.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

Like reference numbers and designations in the various drawings indicate like elements.

DETAILED DESCRIPTION

Certain aspects of the present disclosure provide circuitry connecting an output of voltage reference circuitry powered by a relatively high voltage to an input of a voltage buffer configured to generate a voltage lower than the high voltage. The connecting circuitry prevents the high voltage from reaching the input of the voltage buffer.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Audio Application with Speaker Protection

Figure 1:
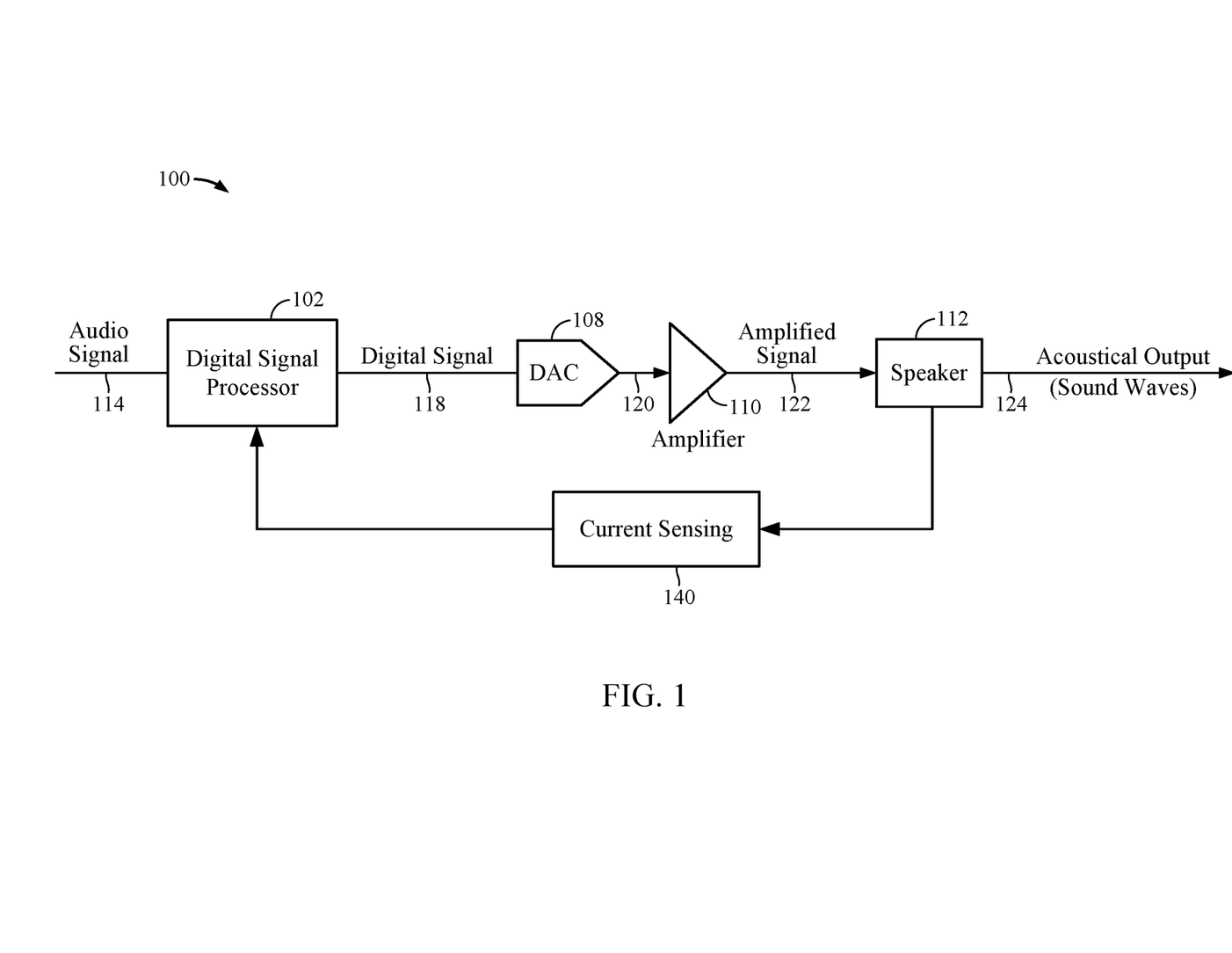
FIG. 1 illustrates an example audio amplifier system, in accordance with certain aspects of the present disclosure.

FIG. 1 illustrates an example audio amplifier system 100, in accordance with certain aspects of the present disclosure. As illustrated, a digital signal processor (DSP) 102 may receive and process audio signals 114 (e.g., a digital audio signal) by, for example, applying a digital filter aimed at increasing audio quality. The filtered digital signal 118 produced by the DSP 102 (or a further processed version thereof) may be converted to an analog signal 120 using a digital-to-analog converter (DAC) 108. In certain aspects, the DAC may be implemented as part of the DSP 102 or an amplifier 110. In certain aspects, the analog signal 120 may be amplified using the amplifier 110 to generate an amplified signal 122. The amplified signal 122 may drive a speaker 112 to produce an acoustic output 124 (e.g., sound waves).

High output volume in mobile devices is becoming more and more important in next-generation mobile devices. Higher volume directly translates to higher output power. The higher volumes may be difficult to achieve with the relatively low voltages provided by lithium-ion batteries. Therefore, on-chip boost switchers may be used to boost the battery voltage to a higher level that supplies the speaker power amplifier (e.g., amplifier 110). The amplifier 110 may be implemented as a class-D amplifier due to the high power efficiency associated with class-D amplifiers. The efficiency of the class-D amplifier may be further improved by implementing the class-D amplifier in an H-bridge configuration.

In certain aspects, a current-voltage (IV)-sense path may be used to sense the speaker current and voltage and provide an estimate of the speaker resistance, which in turn may be used to predict the temperature of the speaker coil. For example, current-sensing circuitry 140 may be used to sense a drive current for the speaker 112, and provide a digital representation of the current to the DSP 102. The current-sensing circuitry 140 may include a voltage reference circuit driving a reference buffer circuit for an analog-to-digital converter (ADC) configured to convert the sensed analog current signal to a digital signal representing the sensed current. The ADC may be implemented as a successive approximation register (SAR) ADC, for example. The voltage reference circuit and the reference buffer circuit may be implemented as described below.

Example Reference Circuitry with Protection

Figure 2A:
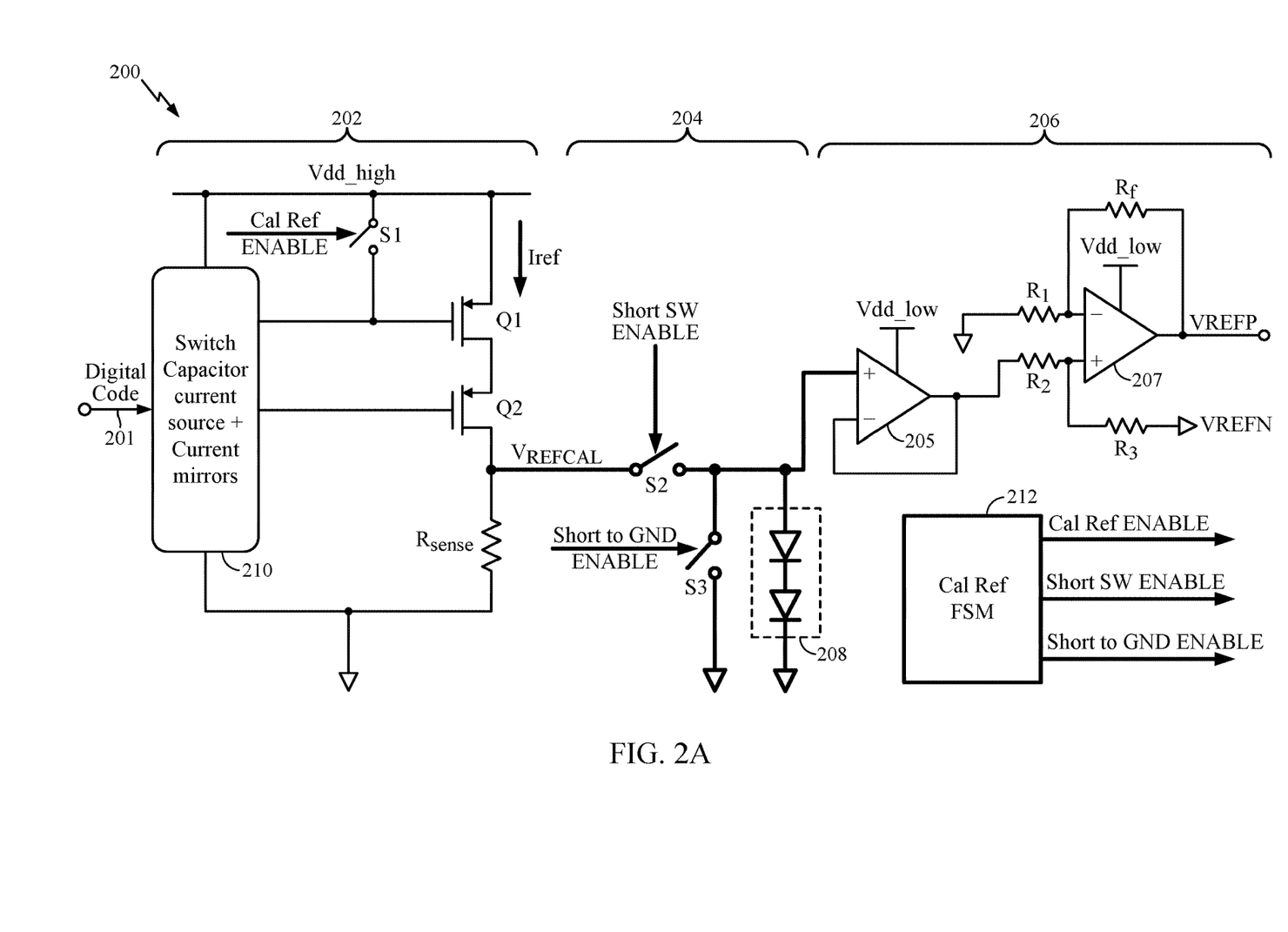
FIG. 2A is a block diagram of an example electronic circuit comprising a voltage reference circuit and a buffer circuit with protection circuitry coupled therebetween, in accordance with certain aspects of the present disclosure.

FIG. 2A is a block diagram of an example electronic circuit 200, in accordance with certain aspects of the present disclosure. The electronic circuit 200 may be included in any of various suitable systems having a reference buffer circuit driven by a voltage reference circuit, including in the current-sensing circuitry 140 of an audio amplifier system, as described above with respect to FIG. 1. As illustrated in FIG. 2A, the electronic circuit 200 includes a voltage reference circuit 202, protection circuitry 204, and a buffer circuit 206.

The voltage reference circuit 202 may be a temperature-compensated and calibrated reference circuit configured to generate a reference voltage labeled "$V_{REFCAL}$." The voltage reference circuit 202 may include a switched-capacitor current source and current mirrors in circuit block 210, a first transistor Q1, a second transistor Q2, and a sense resistor $R_{sense}$. The first and second transistors Q1 and Q2 may be implemented as p-type metal-oxide-semiconductor (PMOS) transistors. The source of the first transistor Q1 may be coupled to a relatively higher voltage rail (labeled "Vdd_high"), the source of the second transistor Q2 may be coupled to the drain of the first transistor Q1, and the drain of the second transistor Q2 may be coupled to a first terminal of the sense resistor $R_{sense}$. Sense resistor may have a nominal resistance value at a given temperature (e.g., 80 kΩ at 55° C.). Circuit block 210 may receive an input signal on input node 201 and generate output signals sent to the gates of the first and second transistors Q1, Q2. The switched-capacitor current source and current mirrors in circuit block 210 may receive power from Vdd_high, and both circuit block 210 and a second terminal of sense resistor $R_{sense}$ may be coupled to a reference potential node (e.g., electrical ground), as illustrated. The voltage reference circuit 202 may also include a switch S1 coupled between Vdd_high and the gate of the first transistor Q1, where switch S1 is controlled by a control signal labeled "Cal Ref ENABLE," which may be generated by and received from a calibrated reference finite state machine 212 (labeled "Cal Ref FSM").

During operation, the voltage reference circuit 202 may receive an input signal at input node 201. The input signal may be a digital code (e.g., a 6-bit digital code), which may be received from a calibration loop during a calibration mode or from a storage device (e.g., an eFuse) during a normal operation mode, such as after a power-on or reset. Based on the digital code, the switched-capacitor current source and the current mirrors in circuit block 210 may output control signals for the gates of the first and second transistors Q1, Q2 for modulating the reference current $I_{ref}$. The reference current $I_{ref}$ flowing across the sense resistor $R_{sense}$ generates the reference voltage $V_{REFCAL}$. For example, $V_{REFCAL}$ may have a nominal value of about 1.25 V at 55° C. and may track the temperature variation in the sense resistor $R_{sense}$. The voltage reference circuit 202 is enabled when switch S1 is open (Cal Ref ENABLE is deactivated) and disabled when switch S1 is closed (Cal Ref ENABLE is activated).

The buffer circuit 206 may include a first amplifier 205 and a second amplifier 207. The first and second amplifiers 205, 207 may both receive power from a relatively lower voltage rail (labeled "Vdd_low"). The output of the first amplifier 205 may be fed back to the negative terminal of the first amplifier, such that the first amplifier is configured as a voltage buffer. The output of the first amplifier 205 may be coupled to an amplifier circuit comprising the second amplifier 207, feedback resistor $R_f$, and resistors $R_1$, $R_2$, and $R_3$. The amplifier circuit may have a gain of $(R_3/(R_2+R_3))((R_f+R_1)/R_1)$ to produce a buffered differential signal pair VREFP/VREFN.

As described above, the voltage reference circuit 202 may receive power from a relatively higher voltage rail (labeled "Vdd_high") (e.g., to provide sufficient headroom for the first and second transistors Q1, Q2), whereas the buffer circuit 206 may receive power from a relatively lower voltage rail (labeled "Vdd_low"). For example, Vdd_high may be around 3.0 V, whereas Vdd_low may be around 1.8 V. During the calibration mode, for example, the output of the voltage reference circuit 202 ($V_{REFCAL}$) may cycle through the entire Vdd_high range (e.g., 0 to 3 V) and exceed the Vdd_low voltage (e.g., 1.8 V) at times, causing reliability issues for the buffer circuit 206, before settling to the final value (e.g., 1.25 V). Furthermore, during normal operation mode (also known as "trimming mode") when an external register or other storage device is used to set $V_{REFCAL}$, the digital code input to the voltage reference circuit 202 can correspond to any value between ground and Vdd_high, which may also exceed Vdd_low.

Accordingly, certain aspects of the present disclosure include the protection circuitry 204 between the output of the voltage reference circuit 202 and the input of the buffer circuit 206. The protection circuitry 204 may include a switch S2 and a switch S3. The switch S2 may have a first terminal coupled to the output of the voltage reference circuit 202 and a second terminal coupled to the input of the buffer circuit 206. In other words, the switch S2 may be coupled in series between the voltage reference circuit 202 and the buffer circuit 206. The switch S3 may have a first terminal coupled to the input of the buffer circuit 206 and the second terminal of the switch S2. The switch S3 may also have a second terminal coupled to the reference potential node (e.g., electrical ground) for the electronic circuit 200. Operation of the switch S2 may be controlled by a control signal labeled "Short SW ENABLE," and operation of the switch S3 may be controlled by a control signal labeled "Short to GND ENABLE." Either or both of the control signals Short SW ENABLE and Short to GND ENABLE may be generated by and received from the Cal Ref FSM 212. With the switches S2 and S3 and the control logic, the protection circuitry 204 prevents the buffer circuit 206 from seeing relatively higher voltages (e.g., >1.8 V) from the voltage reference circuit 202, as described below.

For certain aspects, the protection circuitry 204 may also include a clamping circuit 208 coupled between the input of the buffer circuit 206 and the reference potential node. For example, the clamping circuit 208 may include two series-connected diodes, as illustrated. For other aspects, the clamping circuit 208 may include more than two series-connected diodes.

Figure 2B:
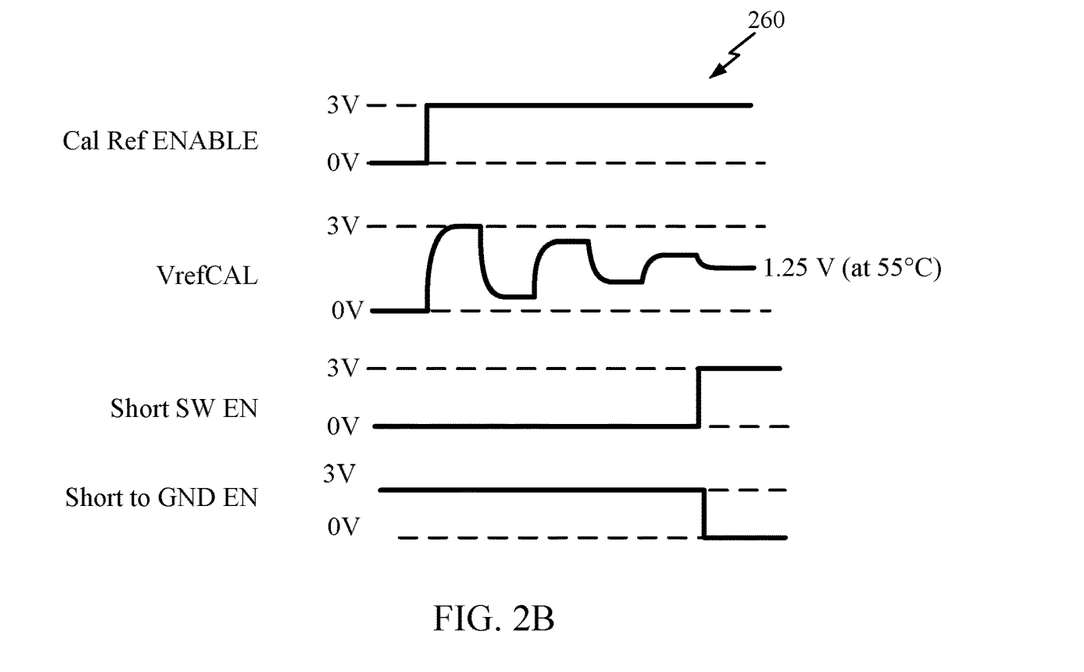
FIG. 2B is an example timing diagram illustrating operating the example circuit of FIG. 2A during a calibration mode, in accordance with certain aspects of the present disclosure.

FIG. 2B is an example timing diagram 260 illustrating operating the example circuit 200 of FIG. 2A during the calibration mode, in accordance with certain aspects of the present disclosure. The calibration mode (e.g., a SAR ADC calibration mode) may be used for determining the digital code (e.g., the 6-bit digital code) for setting a desired reference voltage $V_{REFCAL}$ value. The ADC may set these calibration bits during the calibration mode.

After or upon entering the calibration mode, Cal Ref ENABLE transitions from logic low (e.g., 0 V) to logic high (e.g., 3 V), thereby opening switch S1 according to negative logic (active low). Also, Short SW ENABLE is logic low, and Short to GND ENABLE is logic high, such that switch S2 is open and switch S3 is closed at this time. In this manner, the input to the buffer circuit 206 is shorted to ground and disconnected from the output of the voltage reference circuit 202 during the calibration mode, such that the buffer circuit 206 is not subjected to voltages exceeding Vdd_low. ADC calibration then occurs, and the reference voltage $V_{REFCAL}$ should settle to a nominal value (e.g., 1.25 V) due to the calibration. After a preset number of clock cycles, Short SW ENABLE transitions from logic low to logic high, and Short to GND ENABLE transitions from logic high to logic low, such that switch S2 is closed and switch S3 is opened. This preset number of clock cycles may be selected such that the reference voltage $V_{REFCAL}$ should have already settled by the end of this period. In this manner, the buffer circuit 206 is never exposed to the relatively higher voltages as $V_{REFCAL}$ transitions during the calibration mode. For certain aspects, Short SW ENABLE may transition from logic low to logic high slightly before (e.g., one clock cycle before) Short to GND ENABLE transitions from logic high to logic low. When exiting the calibration mode, Cal Ref ENABLE may return to logic low, thereby opening the switch S1 and allowing the electronic circuit 200 to return to normal operation mode, for example, with the $V_{REFCAL}$ as set by the calibration mode being applied to the buffer circuit 206.

Figure 2C:
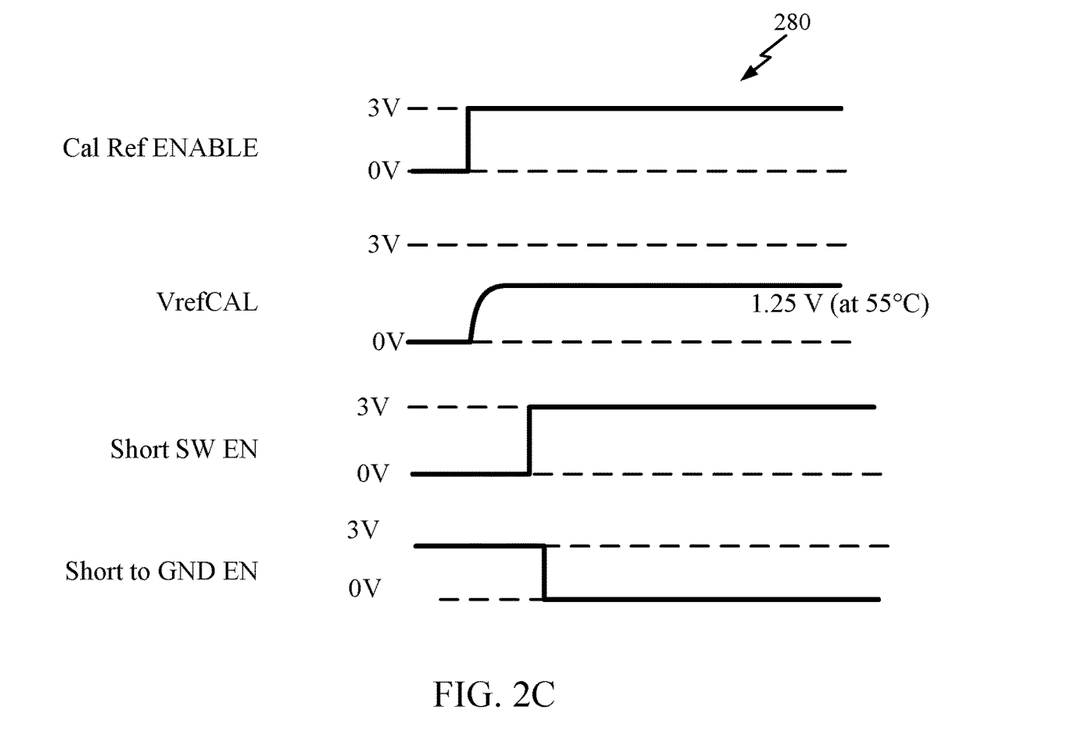
FIG. 2C is an example timing diagram illustrating operating the example circuit of FIG. 2A during a trimming mode, in accordance with certain aspects of the present disclosure.

FIG. 2C is an example timing diagram 280 illustrating operating the example circuit of FIG. 2A during the trimming mode, in accordance with certain aspects of the present disclosure. The trimming mode may occur after powering on a device with the electronic circuit 200 or after a reset of the device or the circuit 200. During the trimming mode, pre-stored bits (e.g., from an eFuse) may be input to the voltage reference circuit 202.

After or upon entering the trimming mode, Cal Ref ENABLE transitions from logic low (e.g., 0 V) to logic high (e.g., 3 V), thereby opening switch S1 according to negative logic. Also, Short SW ENABLE is logic low, and Short to GND ENABLE is logic high, such that switch S2 is open and switch S3 is closed at this time. In this manner, the input to the buffer circuit 206 is shorted to ground and disconnected from the output of the voltage reference circuit 202 during the trimming mode, such that the buffer circuit is not subjected to voltages exceeding Vdd_low. Then, the circuit block 210 controls the transistors Q1 and Q2 to set the reference voltage $V_{REFCAL}$ based on the received digital code, which should settle to the selected value. After a predetermined settling time (which may be set by a preset number of clock cycles), Short SW ENABLE transitions from logic low to logic high, and Short to GND ENABLE transitions from logic high to logic low, such that switch S2 is closed and switch S3 is opened. This predetermined settling time (e.g., 100 µs) may be selected such that the reference voltage $V_{REFCAL}$ should have already settled by the end of this time, no matter the selected value of $V_{REFCAL}$. In this manner, the buffer circuit 206 is never exposed to the relatively higher voltages as $V_{REFCAL}$ settles to the selected value during the trimming mode. For certain aspects, Short SW ENABLE may transition from logic low to logic high slightly before (e.g., one clock cycle before) Short to GND ENABLE transitions from logic high to logic low. When exiting the trimming mode, Cal Ref ENABLE may return to logic low, thereby opening the switch S1 and allowing the electronic circuit 200 to return to normal operation mode, for example.

Figure 2D:
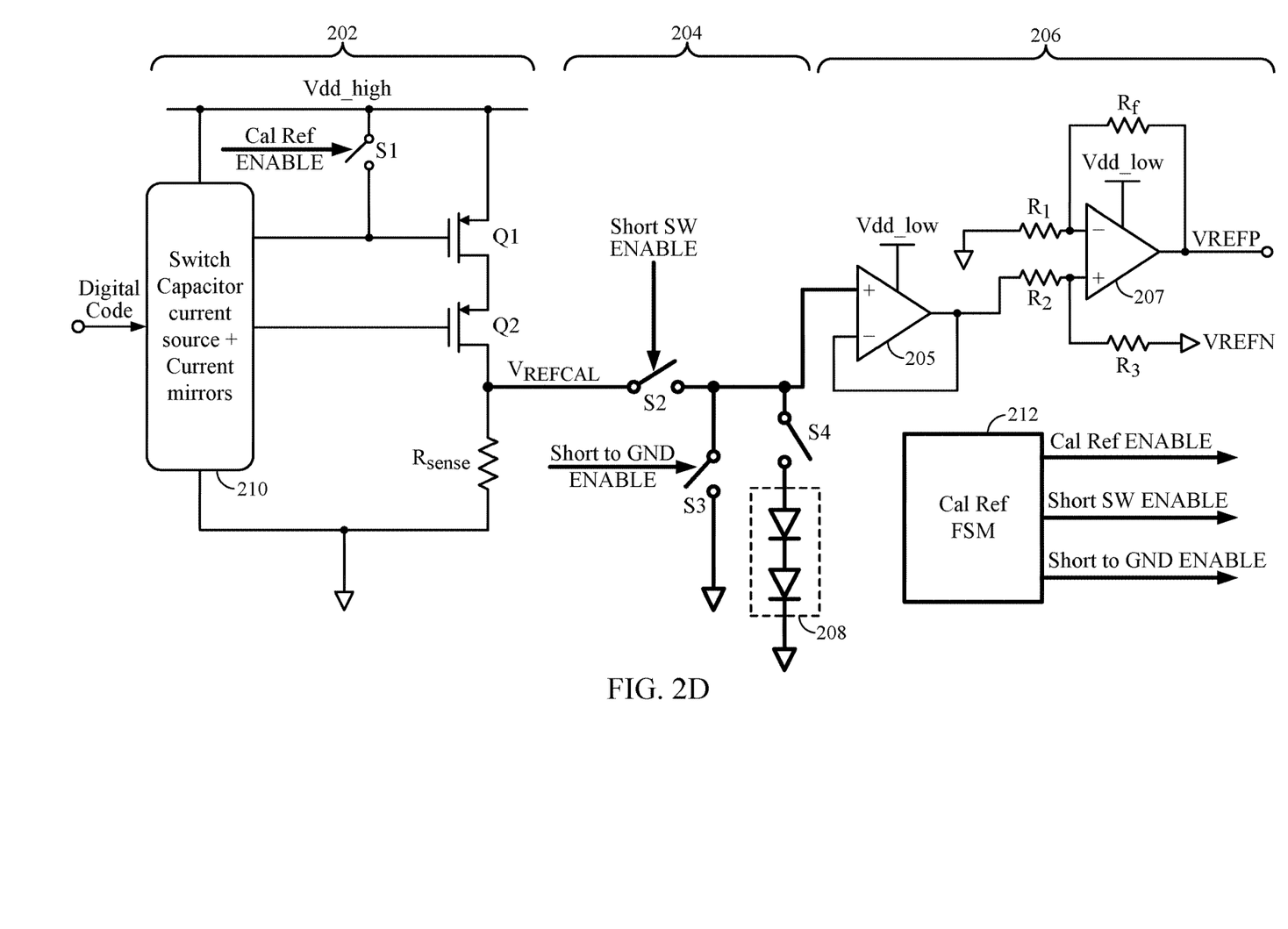
FIG. 2D is a block diagram of an example electronic circuit with a switch added to the protection circuitry of FIG. 2A, in accordance with certain aspects of the present disclosure.

For certain aspects, the clamping circuit 208 may be selectively disconnected from the input of the buffer circuit 206 during certain modes. In this case, as illustrated in FIG. 2D, a switch S4 may be added between the clamping circuit 208 and the input of the buffer circuit 206. For example, the switch S4 may be open or closed during the calibration mode, but should be closed during the trimming mode.

Example Operations for Voltage Reference Generation

Figure 3:
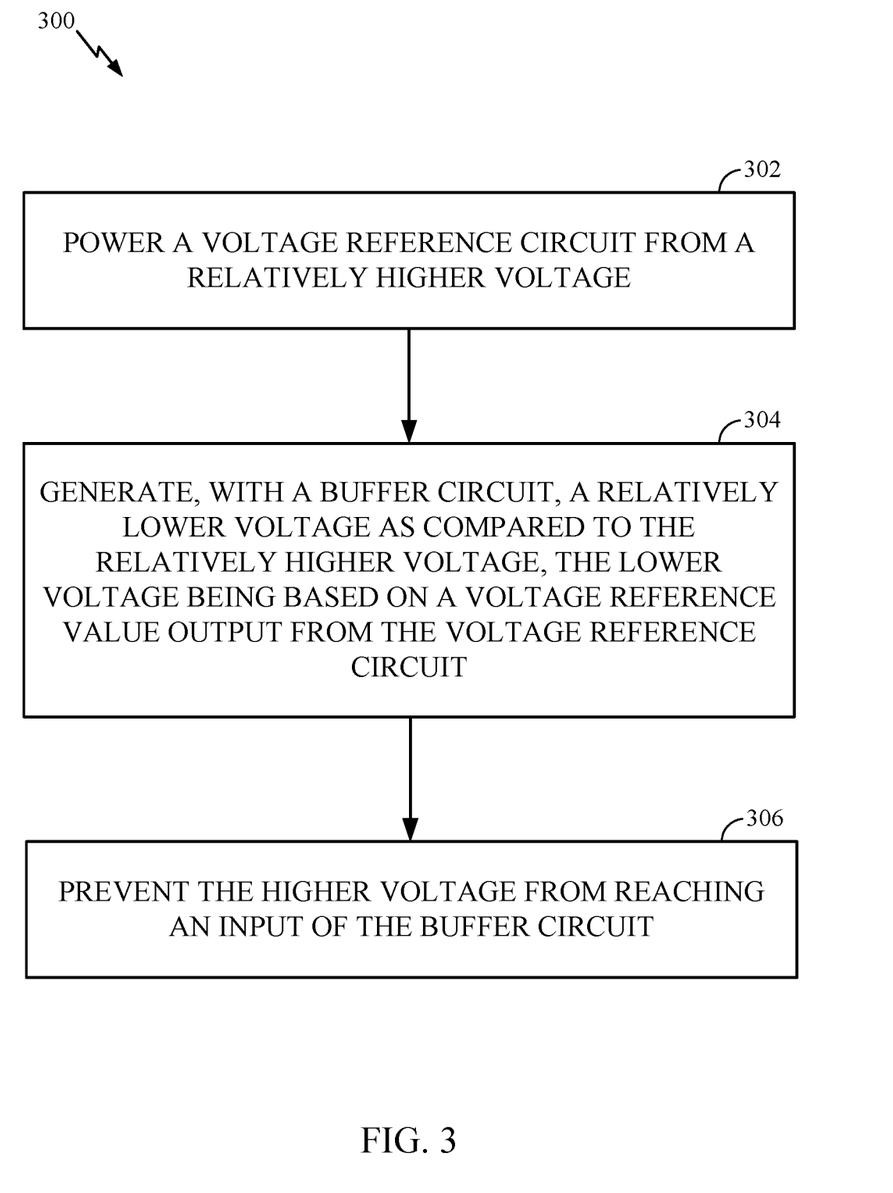
FIG. 3 is a flow diagram of example operations for driving a buffer circuit, in accordance with certain aspects of the present disclosure.

FIG. 3 is a flow diagram of example operations 300 for driving a buffer circuit in generating a voltage reference, in accordance with certain aspects of the present disclosure. The operations 300 may be performed by an electronic circuit, such as the electronic circuit 200 of FIG. 2A or 2D.

The operations 300 may begin, at block 302, with the electronic circuit powering a voltage reference circuit (e.g., voltage reference circuit 202) from a relatively higher voltage (e.g., Vdd_high). At block 304, the buffer circuit (e.g., buffer circuit 206) may generate a relatively lower voltage as compared to the relatively higher voltage. The lower voltage may be based on a voltage reference value (e.g., $V_{REFCAL}$) output from the voltage reference circuit. At block 306, the electronic circuit may prevent the higher voltage from reaching an input of the buffer circuit.

According to certain aspects, the preventing at block 306 may involve opening a first switch (e.g., switch S1) coupled between an output of the voltage reference circuit and the input of the buffer circuit; closing a second switch (e.g., switch S2) coupled between the input of the buffer circuit and a reference potential node (e.g., electrical ground); adjusting the voltage reference value output from the voltage reference circuit; after the adjustment, closing the first switch; and after the adjustment, opening the second switch.

According to certain aspects, the first switch is open during a calibration mode, and the second switch is closed during the calibration mode. For certain aspects, the first switch is closed a predetermined number of clock cycles from a time when the calibration mode was enabled. In this case, the second switch may be opened at, or within one clock cycle after, the predetermined number of clock cycles from the time when the calibration mode was enabled.

According to certain aspects, the first switch is open during a trimming mode, and the second switch is closed during the trimming mode. For certain aspects, the first switch is closed a predetermined number of clock cycles from a time when the trimming mode was enabled. In this case, the second switch may be opened at, or within one clock cycle after, the predetermined number of clock cycles from the time when the trimming mode was enabled.

According to certain aspects, the operations 300 further entail selectively clamping a voltage at the input of the buffer circuit.

According to certain aspects, the voltage reference circuit comprises a temperature-compensated and calibrated voltage reference circuit.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation, and details of the methods and apparatus described above without departing from the scope of the claims.

What is claimed is:

1. An electronic circuit comprising:
 a voltage reference circuit configured to be powered by a relatively higher voltage;
 a buffer circuit configured to generate a relatively lower voltage as compared to the relatively higher voltage; and
 circuitry coupled between an output of the voltage reference circuit and an input of the buffer circuit, the circuitry being configured to prevent the higher voltage from reaching the input of the buffer circuit and comprising a first switch coupled between the output of the voltage reference circuit and the input of the buffer circuit.

2. The electronic circuit of claim 1, wherein the circuitry is configured to prevent the higher voltage from reaching the input of the buffer circuit during at least one of a trimming mode or a calibration mode.

3. The electronic circuit of claim 1, wherein the circuitry further comprises a second switch coupled between the input of the buffer circuit and a reference potential node.

4. The electronic circuit of claim 3, further comprising a clamping circuit coupled between the input of the buffer circuit and the reference potential node.

5. The electronic circuit of claim 4, further comprising a third switch coupled between the clamping circuit and the input of the buffer circuit.

6. The electronic circuit of claim 5, wherein the third switch is configured to be closed during a trimming mode for the voltage reference circuit.

7. The electronic circuit of claim 3, wherein the first switch is configured to be open during a calibration mode and is configured to be closed a predetermined number of clock cycles from a time when the calibration mode was enabled.

8. The electronic circuit of claim 7, wherein the second switch is configured to be closed during the calibration mode and is configured to be open at, or within one clock cycle after, the predetermined number of clock cycles from the time when the calibration mode was enabled.

9. The electronic circuit of claim 3, wherein the first switch is initially configured to be open during a normal operation mode after a power-up or a reset of the electronic circuit and is configured to be closed a predetermined number of clock cycles from a start of the power-up or the reset.

10. The electronic circuit of claim 9, wherein the second switch is initially configured to be closed during the normal operation mode after the power-up or the reset and is configured to be open at, or within one clock cycle after, the start of the power-up or the reset.

11. The electronic circuit of claim 1, further comprising a clamping circuit coupled between the input of the buffer circuit and a reference potential node.

12. The electronic circuit of claim 1, wherein the buffer circuit comprises a voltage reference buffer for an analog-to-digital converter.

13. The electronic circuit of claim 1, wherein the voltage reference circuit comprises a temperature-compensated and calibrated voltage reference circuit.

14. A method of driving a buffer circuit, comprising:
powering a voltage reference circuit from a relatively higher voltage;
generating, with the buffer circuit, a relatively lower voltage as compared to the relatively higher voltage, the lower voltage being based on a voltage reference value output from the voltage reference circuit; and
preventing the higher voltage from reaching an input of the buffer circuit, wherein the preventing comprises opening a first switch coupled between an output of the voltage reference circuit and the input of the buffer circuit.

15. The method of claim 14, wherein the preventing further comprises:
closing a second switch coupled between the input of the buffer circuit and a reference potential node;
adjusting the voltage reference value output from the voltage reference circuit;
after the adjustment, closing the first switch; and
after the adjustment, opening the second switch.

16. The method of claim 15, wherein:
the first switch is open during a calibration mode;
the second switch is closed during the calibration mode;
the first switch is closed a predetermined number of clock cycles from a time when the calibration mode was enabled; and
the second switch is opened at, or within one clock cycle after, the predetermined number of clock cycles from the time when the calibration mode was enabled.

17. The method of claim 15, wherein:
the first switch is open during a trimming mode;
the second switch is closed during the trimming mode;
the first switch is closed a predetermined number of clock cycles from a time when the trimming mode was enabled; and
the second switch is opened at, or within one clock cycle after, the predetermined number of clock cycles from the time when the trimming mode was enabled.

18. The method of claim 14, further comprising selectively clamping a voltage at the input of the buffer circuit.

19. An electronic circuit comprising:
a voltage reference circuit configured to be powered by a relatively higher voltage;
a buffer circuit configured to generate a relatively lower voltage as compared to the relatively higher voltage;
a first switch coupled between an output of the voltage reference circuit and an input of the buffer circuit; and
a second switch coupled between the input of the buffer circuit and a reference potential node for the electronic circuit.

* * * * *